US009568964B2

(12) United States Patent
Lee et al.

(10) Patent No.: US 9,568,964 B2
(45) Date of Patent: Feb. 14, 2017

(54) COOLING STRUCTURE INTEGRATED ALL-IN-ONE COMPUTER

(71) Applicant: DATAVAN INTERNATIONAL CORP., New Taipei (TW)

(72) Inventors: Chun-Yi Lee, New Taipei (TW); Yu-Chen Chang, New Taipei (TW)

(73) Assignee: DATAVAN INTERNATIONAL CORP., New Taipei (TW)

( * ) Notice: Subject to any disclaimer, the term of this patent is extended or adjusted under 35 U.S.C. 154(b) by 126 days.

(21) Appl. No.: 14/676,376

(22) Filed: Apr. 1, 2015

(65) Prior Publication Data

US 2016/0291650 A1   Oct. 6, 2016

(51) Int. Cl.
| | |
|---|---|
| *G06F 1/20* | (2006.01) |
| *G06F 1/16* | (2006.01) |
| *G06F 1/18* | (2006.01) |
| *H05K 5/02* | (2006.01) |
| *H05K 7/14* | (2006.01) |

(52) U.S. Cl.
CPC ............. *G06F 1/20* (2013.01); *G06F 1/1613* (2013.01); *G06F 1/1626* (2013.01); *G06F 1/1637* (2013.01); *G06F 1/184* (2013.01); *G06F 1/203* (2013.01); *H05K 5/0217* (2013.01); *H05K 7/14* (2013.01)

(58) Field of Classification Search
CPC .... G06F 1/1626; G06F 1/1637; G06F 1/1656; G06F 1/1613; G06F 1/203; G06F 1/1601; G06F 1/181; G06F 15/0216; G06F 1/184; G06F 1/20; G06F 2200/1612; G06F 1/16; G06F 1/1607; G06F 1/1616; G06F 1/1628; G06F 1/1633; G06F 2200/1631; H04M 1/0274; H05K 5/0017; H05K 5/02; H05K 5/0217; H05K 7/14; H05K 5/0004; H05K 5/0204
See application file for complete search history.

(56) References Cited

U.S. PATENT DOCUMENTS

| | | | | |
|---|---|---|---|---|
| 5,515,303 A | * | 5/1996 | Cargin, Jr. | B60R 11/02 235/375 |
| 5,583,529 A | * | 12/1996 | Satou | G06F 1/1616 345/87 |
| 6,053,410 A | * | 4/2000 | Wike, Jr. | G06F 1/16 235/462.43 |

(Continued)

*Primary Examiner* — Courtney Smith
*Assistant Examiner* — Michael Matey
(74) *Attorney, Agent, or Firm* — Muncy, Geissler, Olds & Lowe, P.C.

(57) ABSTRACT

A cooling structure integrated all-in-one computer includes a display device including a hollow frame having retaining members located therein, a first electric connector mounted in the hollow frame and a display module mounted in the hollow frame, and a mainframe including an aluminum extruded casing slidably inserted into a back opening of the hollow frame, engaging members located in the casing for engaging the retaining members upon insertion of the casing into the hollow frame, and a motherboard mounted in a recessed accommodation chamber in the casing with heat-emitting sources thereof abutted against respective heat-transferring bearing blocks of the casing for quick dissipation of heat and a second electric connector thereof connected to the first electric connector.

10 Claims, 8 Drawing Sheets

(56) References Cited

U.S. PATENT DOCUMENTS

| | | | | |
|---|---|---|---|---|
| 6,229,695 B1* | 5/2001 | Moon | G06F 1/1626 | 312/223.2 |
| 6,381,124 B1* | 4/2002 | Whitcher | G02F 1/133308 | 248/917 |
| 6,504,711 B2* | 1/2003 | Wu | G06F 1/1613 | 361/679.47 |
| 8,351,212 B2* | 1/2013 | Ku | G06F 1/181 | 165/80.2 |
| 8,560,090 B2* | 10/2013 | Sasaki | G05B 19/10 | 700/17 |
| 8,941,981 B2* | 1/2015 | Reber | G06F 1/1632 | 345/102 |
| 9,218,020 B1* | 12/2015 | Martinez | G06F 1/1613 | |
| 2010/0182262 A1* | 7/2010 | Yoshikawa | G06F 1/1601 | 345/173 |
| 2011/0176268 A1* | 7/2011 | Kuang | G06F 1/16 | 361/679.22 |
| 2012/0099261 A1* | 4/2012 | Reber | G06F 1/1632 | 361/679.3 |
| 2012/0170199 A1* | 7/2012 | Ku | G06F 1/181 | 361/679.21 |
| 2013/0135814 A1* | 5/2013 | Lee | G06F 1/20 | 361/679.33 |
| 2013/0301224 A1* | 11/2013 | Chu | H02G 3/14 | 361/728 |
| 2014/0199422 A1* | 7/2014 | Nathanson | B29C 45/14655 | 425/123 |
| 2015/0137734 A1* | 5/2015 | Wojcik | G06K 7/082 | 320/103 |
| 2016/0182112 A1* | 6/2016 | Kim | H01Q 1/243 | 455/572 |

* cited by examiner

COOLING STRUCTURE INTEGRATED ALL-IN-ONE COMPUTER

BACKGROUND OF THE INVENTION

1. Field of the Invention

The present invention relates to computer technology, and more particularly to a cooling structure integrated all-in-one computer, in which comprises a display device comprising a hollow frame and a display module mounted in the hollow frame, and a mainframe comprising a casing made from extruded aluminum and detachably slidably inserted into a back opening of the hollow frame and a motherboard mounted in the casing with heat-emitting sources thereof kept in direct contact with the casing for quick dissipation of heat.

2. Description of the Related Art

Following fast development of electronic technology, advanced electronic apparatus having the characteristics of strong operational capabilities, high operating speed and small size have been continuously created. With the popularity of computers and networks, most general family or company will use computers and the Internet. Even in the shops, restaurants and other places, we can see the use of computers and the Internet. Further, the retailing industry is moving toward the chain system. Many retail operators adopt point of sales management system (POS), electronic ordering system (EOS) or computer assisted ordering system for registering and calculating transactions, scanning barcodes, drawing up invoices or receipts, ordering, providing the latest news, analyzing and handling product information, membership information and sales data, saving a large amount of manpower and operating costs.

Because the computer cannot directly display data a display device is necessary so that a user or client can see the related information. A computer system generally comprises a mainframe and a display device. However, the mainframe and the display device all occupy some space. Under the market trend to provide a product having light, thin, short and small characteristics, a computer system composed of a mainframe and a display device can no longer meet the needs of consumers. Therefore, some manufacturers have all the electronic component parts of a mainframe be integrated in a display device to create an all-in-one computer. Most commercial all-in-one computers use a LCD display for display images, and mount it in a front side of a housing thereof. In order to maximize the viewing screen, the size of the LCD display is made in line with the size of the housing as much as possible.

For enabling the housing to match with the maximum size of the LCD display, the motherboard and the related electronic components (such as hard disk drive, display card, memory, cooling fan, electrical connectors, etc.) shall be mounted at the back side of the LCD display, and then mounted with the LCD display inside the housing. This layered structural design enables the dimension of the computer to be minimized. However, following the development of the trend of computer market goes toward high speed applications, the heat dissipation problem of CPU, image processor and other heat-emitting components has become a critical issue. Reducing the size of a computer relatively reduces its available internal heat dissipation space. Accumulation of waste heat in a computer can lead to computer failure. For quick dissipation of waste heat, it is the common method to stack up a radiation fins and cooling fans on the surface of the heat-emitting source (such as CPU) of the motherboard, forming a cooling module for quick dissipation of heat from the heat-emitting source. However, stacking up radiation fins and cooling fans on the surface of the heat-emitting source greatly increases the overall thickness of the all-in-one computer. Further, mounting a large amount of radiation fins and cooling fans in an all-in-one computer will also greatly increase the cost of the computer. An improvement in this regard is desired.

SUMMARY OF THE INVENTION

The present invention has been accomplished under the circumstances in view. It is therefore the main object of the present invention to provide a cooling structure integrated all-in-one computer, which comprises a display device and a mainframe. The display device comprises a hollow frame defining opposing front and back openings and a mating connection space in communication between the front and back openings, a plurality of retaining members bilaterally located in the back opening and projecting into the mating connection space, each retaining member comprising a retaining groove, a display module mounted in the mating connection space, and a connector unit mounted in a top side inside the hollow frame and electrically coupled to the display module. The connector unit comprises a first electric connector. The mainframe comprises a casing made from extruded aluminum and mounted in the back opening of the hollow frame, the casing comprising a front wall abutted against the hollow frame around the front opening, a recessed accommodation chamber located in the front wall and a plurality of engaging members located at two opposite locations in a top side in the recessed accommodation chamber, each engaging member comprising a stepped hook portion slidably engageable into the retaining groove of one respective retaining member of the display device, a motherboard mounted in the recessed accommodation chamber, the motherboard comprising at least one heat-emitting source abutted against an inner surface of the casing, and a mating connector unit located at a top side of the motherboard. The mating connector unit comprises a second electric connector slidably detachably connectable to the first electric connector of the connector unit of the display device. During operation of the cooling structure integrated all-in-one computer, waste heat produced by the heat-emitting source can be directly transferred to the aluminum extruded casing for quick dissipation.

Subject to the arrangement of directly attaching the heat-emitting source of the motherboard to heat-transferring bearing blocks of the casing, or sandwiching a heat sink in between the heat-emitting source and the heat-transferring bearing blocks of the casing, a heat transfer path is created in the cooling structure integrated all-in-one computer. During working of the display device with the mainframe, waste heat produced by the heat-emitting source can be quickly transferred through the heat sink to the casing for quick dissipation into the surrounding air. Further, the casing comprises two side panels each having a plurality of through holes. Thus, outside cooling air can go through the through holes of the side panels of the casing to enhance heat dissipation. Because the casing is made from extruded aluminum, it provides a large heat dissipation surface area, and thus, the motherboard does not require a large amount of radiation fins and cooling fans for heat dissipation, and the temperature of the mainframe can be constantly kept in the normal operating range. The compact design of the present invention achieves of objects of simple structure, small size and low manufacturing cost.

Further, when wishing to separate the display device from the mainframe, move the casing along the hollow frame in direction away from the connector unit to disengage the stepped hook portions of the engaging members from the retaining grooves of the respective retaining members of the hollow frame and the second electric connector of the mating connector unit of the motherboard from the first electric connector of the connector unit, and then remove the casing from the mating connection space of the hollow frame. The sliding engaging arrangement between the engaging members of the casing and the retaining members of the hollow frame facilitates mounting and dismounting of the cooling structure integrated all-in-one computer without screws, assuring a high level of structural stability. When mounting or dismounting the cooling structure integrated all-in-one computer in a narrow space, the hollow frame and its internal component parts will not hinder the installation of the casing, and thus, the invention facilitates mounting and dismounting with less effort.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
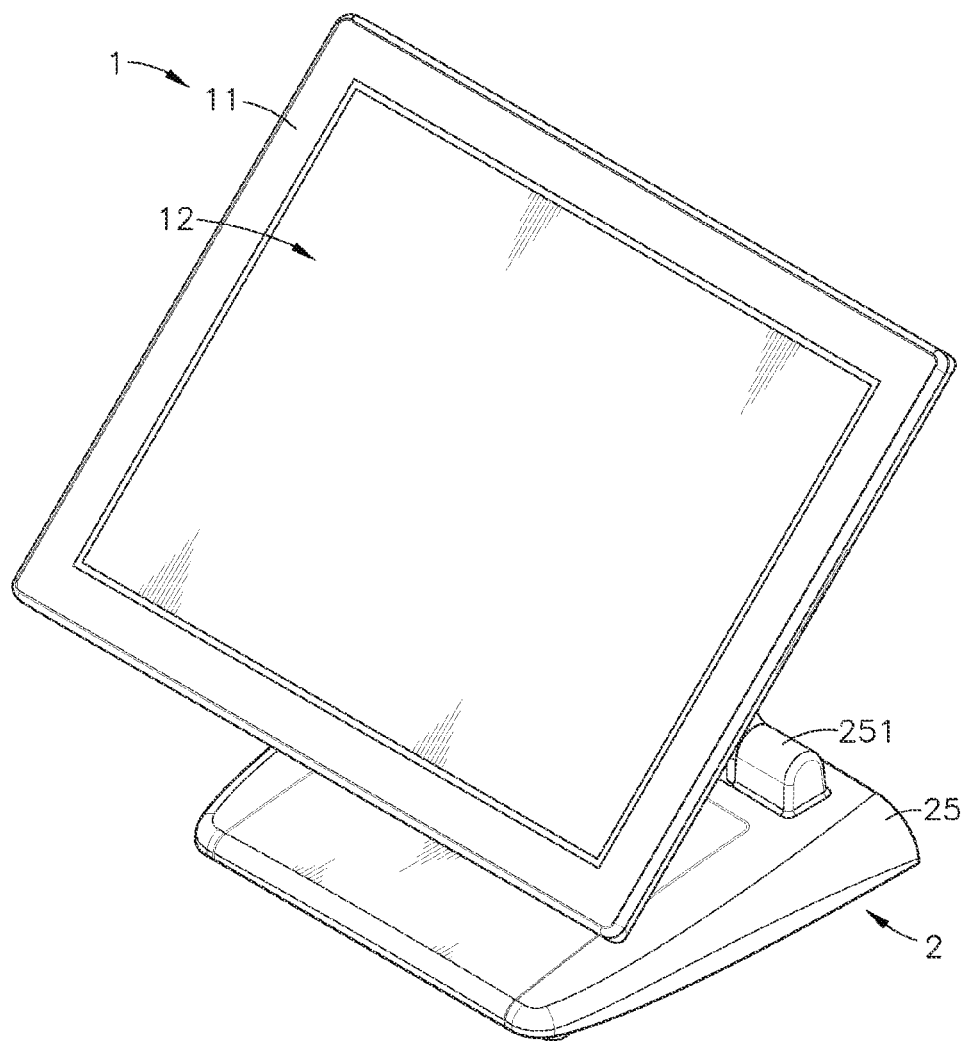
FIG. 1 is an oblique top elevational view of a cooling structure integrated all-in-one computer in accordance with the present invention.
Figure 2:
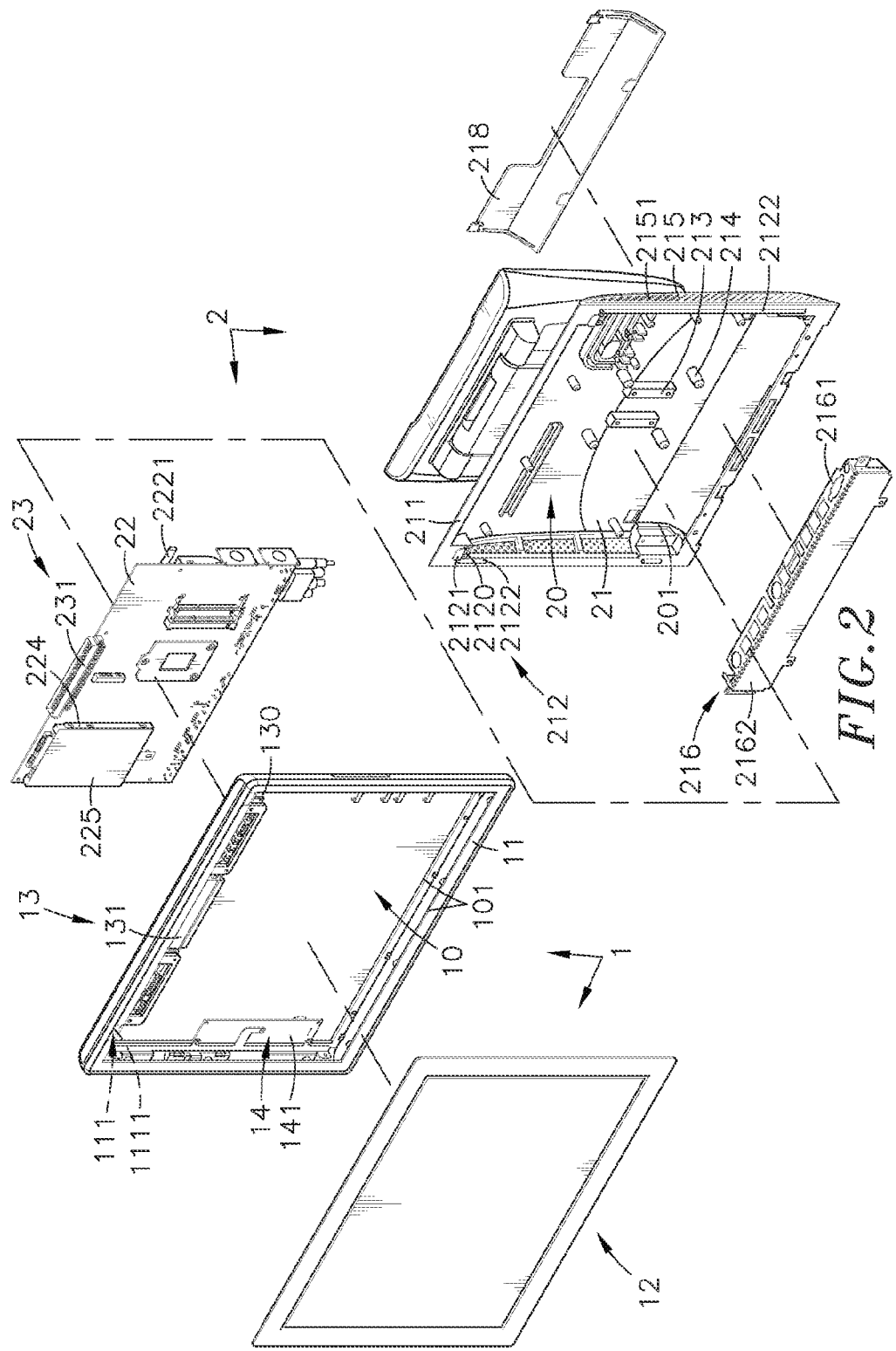
FIG. 2 is an exploded view of the cooling structure integrated all-in-one computer in accordance with the present invention.
Figure 3:
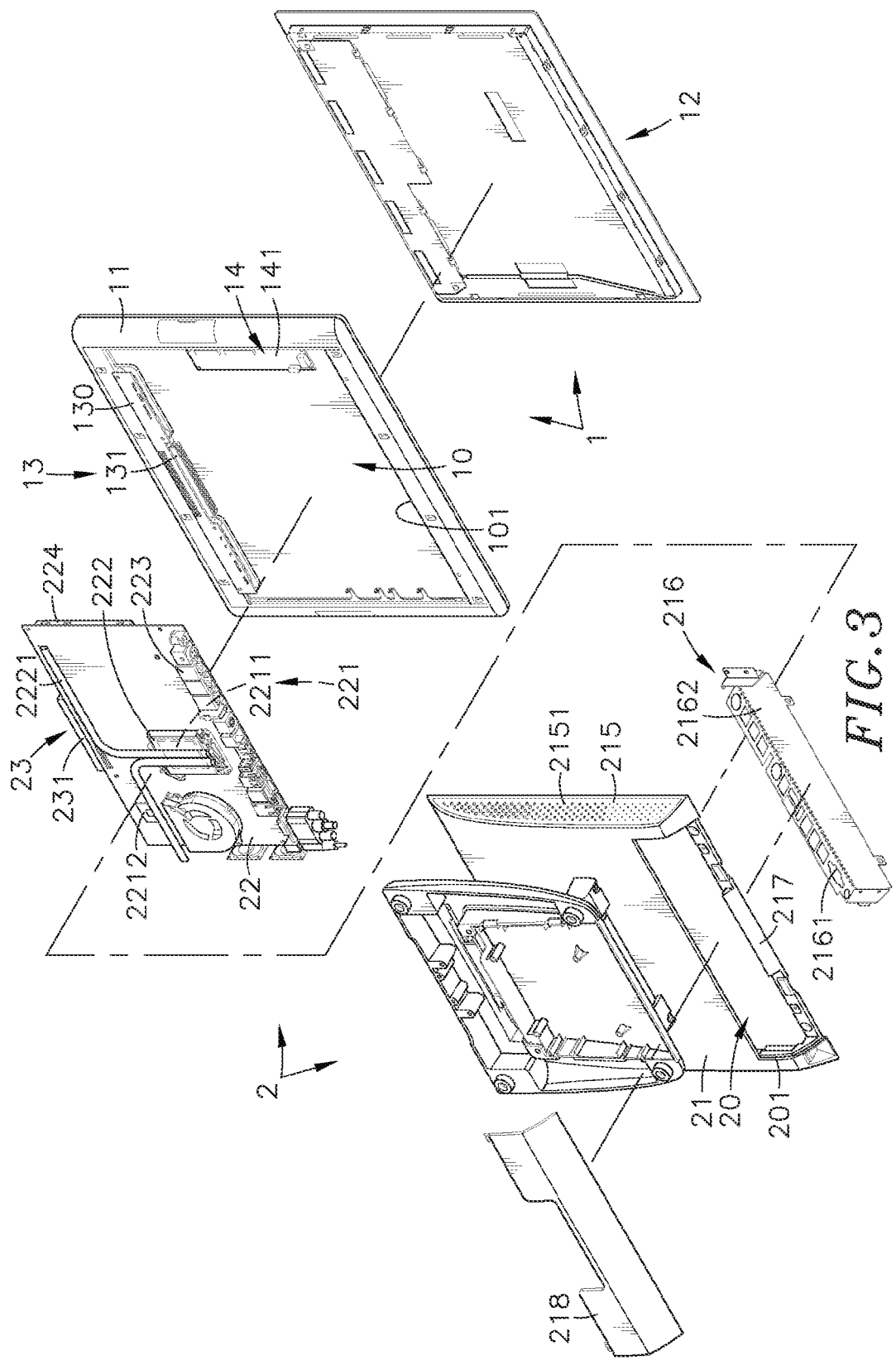
FIG. 3 corresponds to FIG. 2 when viewed from another angle.
Figure 4:
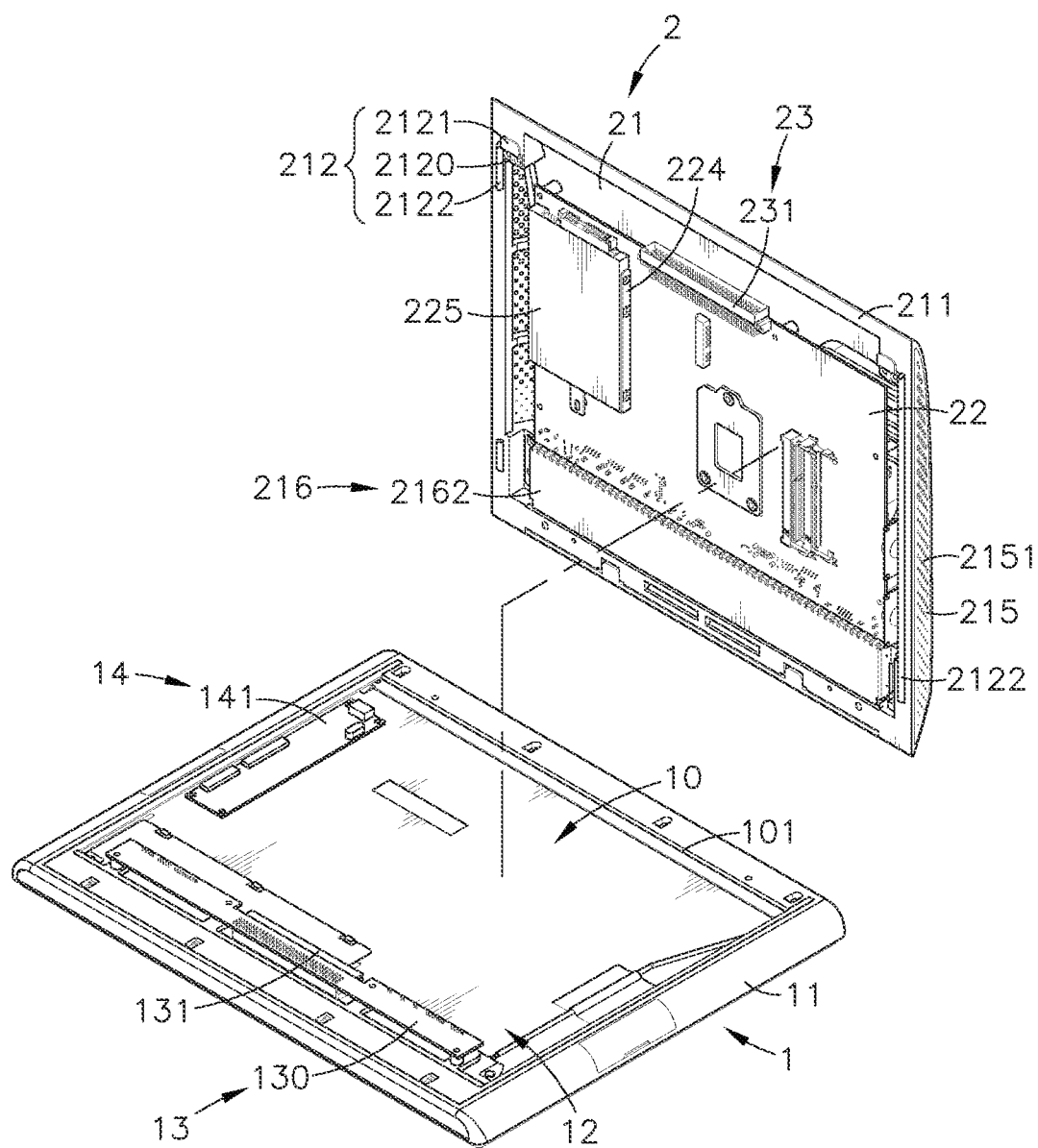
FIG. 4 is an exploded view of the present invention, illustrating the display device and the mainframe respectively assembled before connection.

Referring to FIGS. 1-4, a cooling structure integrated all-in-one computer in accordance with the present invention is shown. The computer comprises a display device 1, and a mainframe 2.

The display device 1 comprises a hollow frame 11, a display module 12, a connector unit 13, and a control module 14. The hollow frame 11 comprises a mating connection space 10 having opposing front and back openings 101, and a plurality of retaining members 111 located at two opposite locations in a top side in the back-sided opening 101. Each retaining member 111 comprises a retaining groove 1111 extending downward and disposed in communication with the mating connection space 10. The display module 12 is mounted in the mating connection space 10. The connector unit 13 comprises a circuit board 130 mounted in a top side inside the hollow frame 11 between two retaining members 111, and a first electric connector 131 (for example, plug connector) installed in the circuit board 130. The control module 14 comprises a circuit board 141 mounted in one lateral side in the back-sided opening 101. Further, the circuit board 130 of the connector unit 13 is electrically connected to the display module 12 and the circuit board 141 of the control module 14 by cables, bus lines or connectors, and thus, the display settings of the display module 12 can be controlled through the control module 14. Further, the display module 12 can have a touch panel integrated therein to provide a touch function.

The mainframe 2 comprises a casing 21 made from extruded aluminum. The casing 21 comprises a recessed accommodation chamber 20 located in a front wall 211 thereof, and two engaging members 212 respectively located at respective top ends in two opposite lateral sides in the recessed accommodation chamber 20.

Each engaging member 212 comprises a base portion 2120 affixed to the front wall 211 of the casing 21 with screws, a stepped hook portion 2121 upwardly extended from the base portion 2120, and a plurality of rails 2122 longitudinally located on the front wall 211 of the casing 21.

The casing 21 further comprises a plurality of heat-transferring bearing blocks 213 located in the recessed accommodation chamber 20, a plurality of internally threaded columns 214 located in the recessed accommodation chamber 20 around the heat-transferring bearing blocks 213, two side panels 215 respectively located at two opposite lateral sides relative to the recessed accommodation chamber 20, a plurality of through holes 2151 located in each side panel 215, a transverse slot 201 abutted to a bottom side of the recessed accommodation chamber 20, and a finger plate 217 located at a bottom side of the transverse slot 201 on the middle.

The mainframe 2 further comprises a motherboard 22 affixed to the internally threaded columns 214 in the recessed accommodation chamber 20 of the casing 21 by screws, a back plate 216 inserted into the transverse slot 201 of the casing 21, and an outer cover 218 detachably fastened to the transverse slot 201 to cover the back plate 216. The back plate 216 comprises a vertical mounting wall 2162 affixed to the casing 21 by screws, and a plurality of pierced holes 2161 arranged in a line.

The aforesaid motherboard 22 comprises at least one heat-emitting source 221 respectively supported on one respective heat-transferring bearing block 213. The heat-emitting source 221 can be a CPU 2211, image processor 2212, or other kind of IC chip directly abutted against the surface of one respective heat-transferring bearing block 213 in the casing 21. In this embodiment, a heat sink 222 is sandwiched between the motherboard 22 and the casing 21, having opposing front and back surfaces thereof respectively abutted against the at least one heat-emitting source 221 and at least one of the heat-transferring bearing block 213. Further, the heat sink 222 has heat pipes 2221 installed therein. The heat pipes 2221 extend out of the heat sink 222 and are bonded to the inner wall of the casing 21. The motherboard 22 further comprises a mating connector unit 23. The mating connector unit 23 comprises a second electric connector 231 (for example, socket connector) located at a top side of the motherboard 22. The motherboard 22 further comprises a plurality of ports 223 (such as power jack, audio jack, RJ-45 connector, USB connector, HDMI connector, etc.) respectively located in the pierced holes 2161 of the back plate 216. Further, electrical cables (not shown) are respectively connected to the ports 223 for signal input and output. The motherboard 22 further has mounted therein other electronic components (such as memory, display card, connectors, expansion slots, etc.), cooling fan, and a rack 224 for the insertion of a hard disk drive 225.

Figure 5:
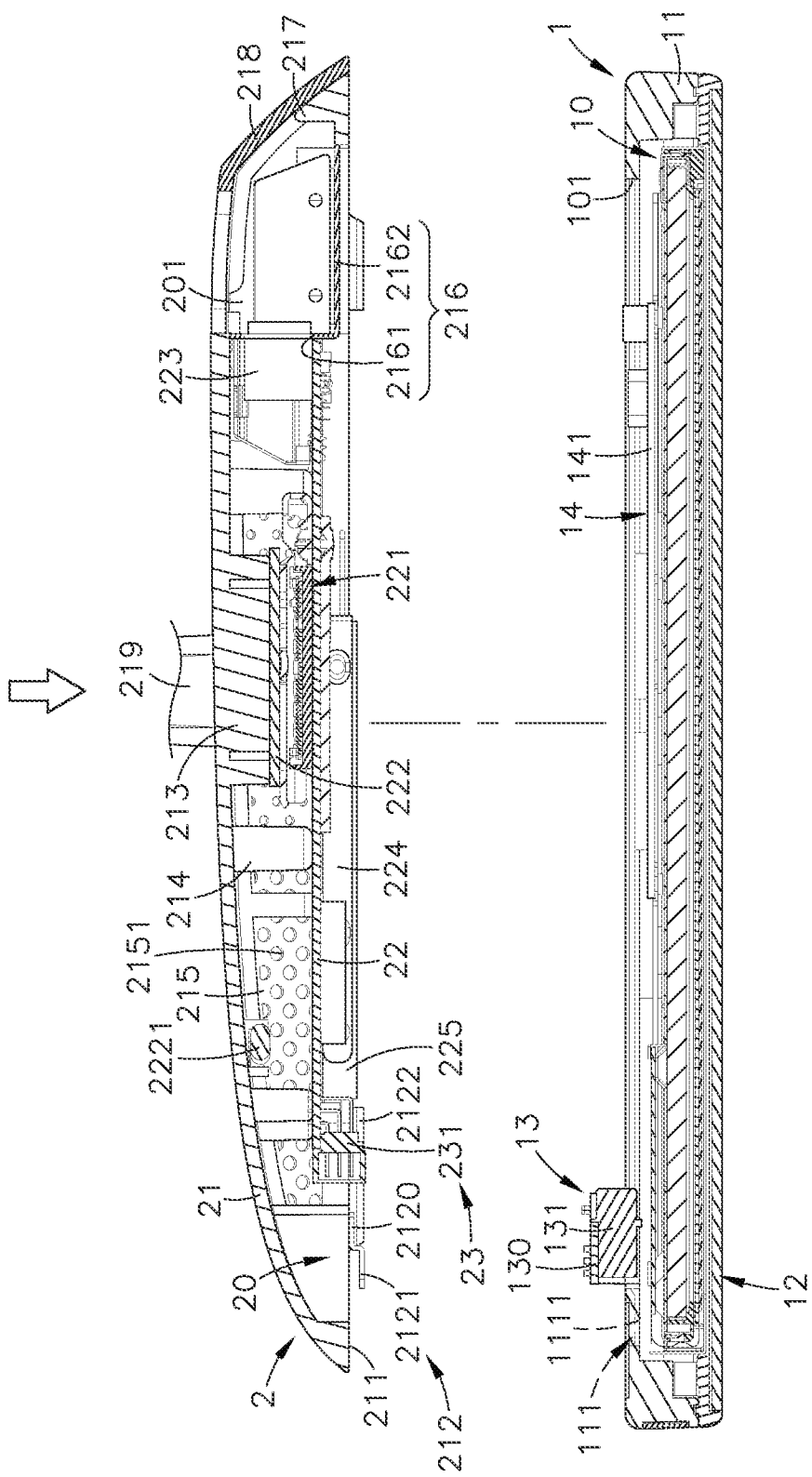
FIG. 5 is a sectional view of the cooling structure integrated all-in-one computer in accordance with the present invention before connection between the display device and the mainframe.
Figure 6:
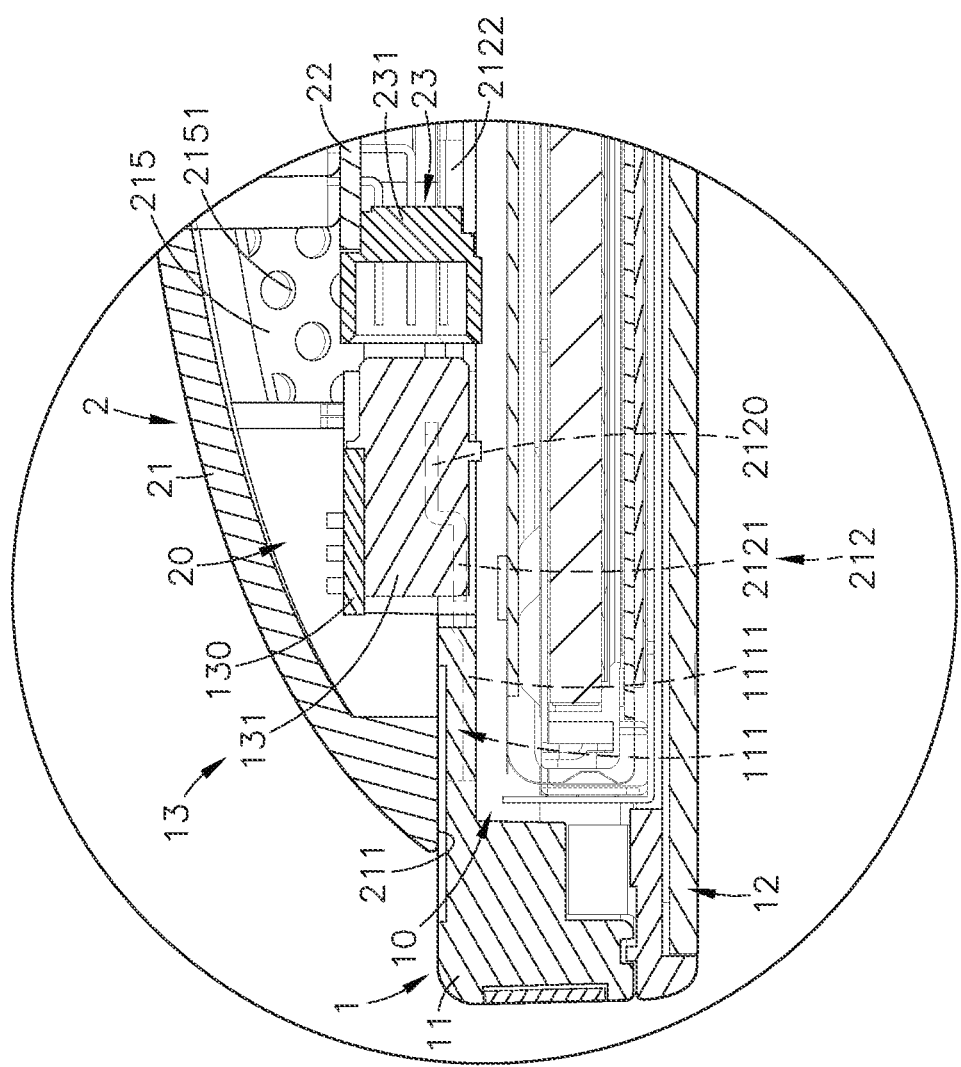
FIG. 6 is a sectional view of a part of the present invention, illustrating the display device attached to the mainframe.
Figure 7:
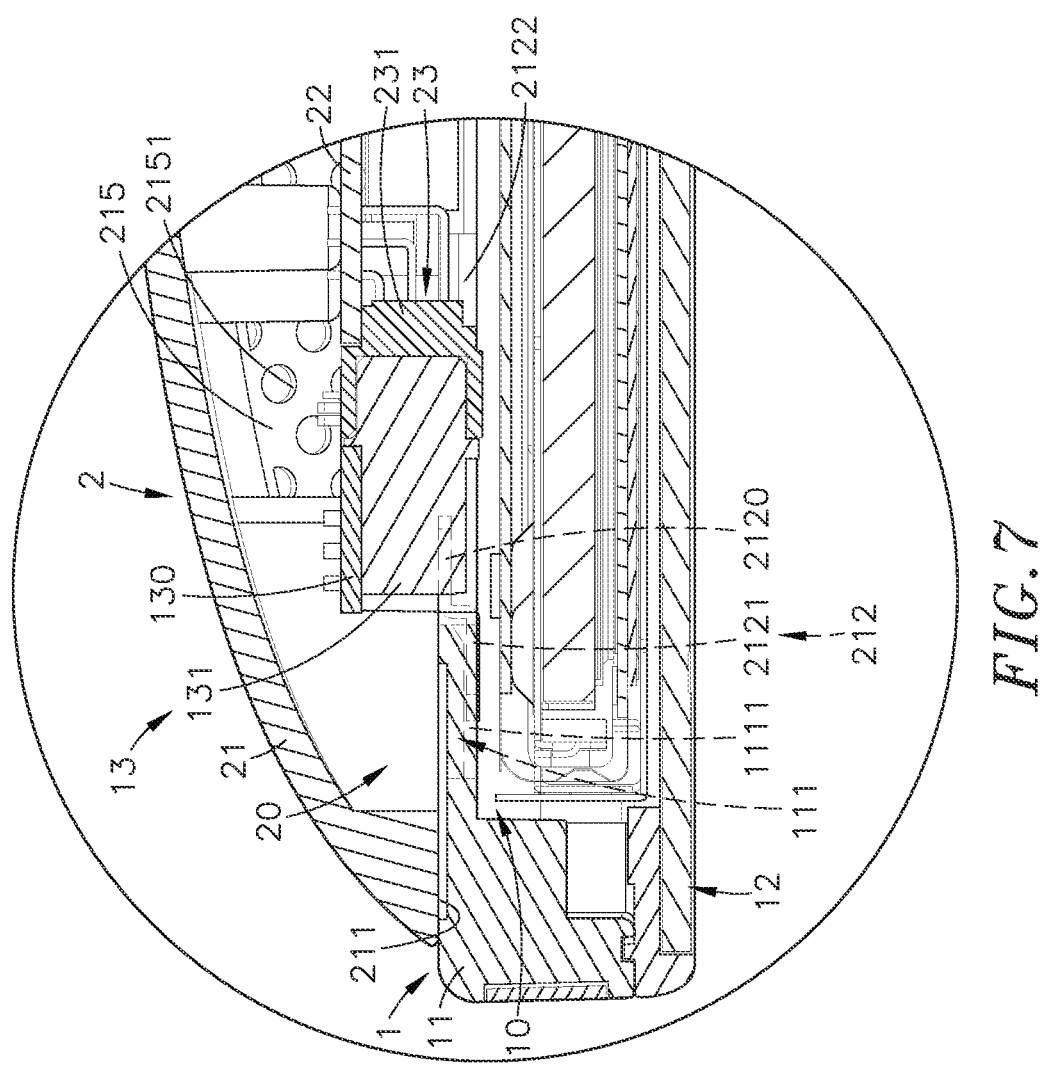
FIG. 7 corresponds to FIG. 6, illustrating the display device and the mainframe assembled together.

Referring to FIGS. 5-7, when assembling the cooling structure integrated all-in-one computer, hold the casing 21 of the mainframe 2 transversely in horizontal to face the front wall 211 of the casing 21 toward the front-sided opening 101 of the hollow frame 11 of the display device 1, and then attach the casing 21 downwardly to the hollow frame 11 to abut the front wall 211 of the casing 21 against the front surface of the hollow frame 11 around the opening 101 and to insert the stepped hook portions 2121 and rails 2122 engaging members 212 into the mating connection space 10 of the hollow frame 11, and then push the casing 21 relative to the hollow frame 11 to move the rails 2122 along the inner perimeter of the hollow frame 11 around the front-sided opening 101 steadily in one direction, thereby forcing the stepped hook portions 2121 of the engaging members 212 into engagement with the retaining grooves 1111 of the respective retaining members 111 of the hollow frame 11 and the second electric connector 231 of the mating connector unit 23 of the motherboard 22 into connection with the first electric connector 131 of the connector unit 13, and thus, the display device 1 and the mainframe 2 are fastened together and electrically connected.

When wishing to separate the display device 1 from the mainframe 2, operate the finger plate 217 of the casing 21 to move the casing 21 along the hollow frame 11 in direction away from the connector unit 13 to further disengage the stepped hook portions 2121 of the engaging members 212 from the retaining grooves 1111 of the respective retaining members 111 of the hollow frame 11 and the second electric connector 231 of the mating connector unit 23 of the motherboard 22 from the first electric connector 131 of the connector unit 13, and then remove the casing 21 from the mating connection space 10 of the hollow frame 11. The sliding engaging arrangement between the engaging members 212 of the casing 21 and the retaining members 111 of the hollow frame 11 facilitates mounting and dismounting of the cooling structure integrated all-in-one computer without screws, assuring a high level of structural stability. When mounting or dismounting the cooling structure integrated all-in-one computer in a narrow space, the hollow frame 11 and its internal component parts will not hinder the installation of the casing 21, and thus, the invention facilitates mounting and dismounting with less effort.

Subject to the arrangement of directly attaching the heat-emitting source 221 of the motherboard 22 to the heat-transferring bearing blocks 213 of the casing 21, or sandwiching the heat sink 222 in between the heat-emitting source 221 and the heat-transferring bearing blocks 213 of the casing 21, a heat transfer path is created in the cooling structure integrated all-in-one computer. During working of the display device 1 with the mainframe 2, waste heat produced by the heat-emitting source 221 (such as CPU 2211, image processor 2212, or other kind of IC chip) can be quickly transferred through the heat sink 222 and its heat pipes 2221 to the heat-transferring bearing blocks 213 of the casing 21 for quick dissipation into the surrounding air. At the same time, outside cooling air can go through the through holes 2151 of the side panels 215 of the casing 21 to enhance heat dissipation. Because the casing 21 is made from extruded aluminum, it provides a large heat dissipation surface area, and thus, the motherboard 22 does not require a large amount of radiation fins and cooling fans for heat dissipation, and the temperature of the mainframe 2 can be constantly kept in the normal operating range. The compact design of the present invention achieves of objects of simple structure, small size and low manufacturing cost.

Figure 8:
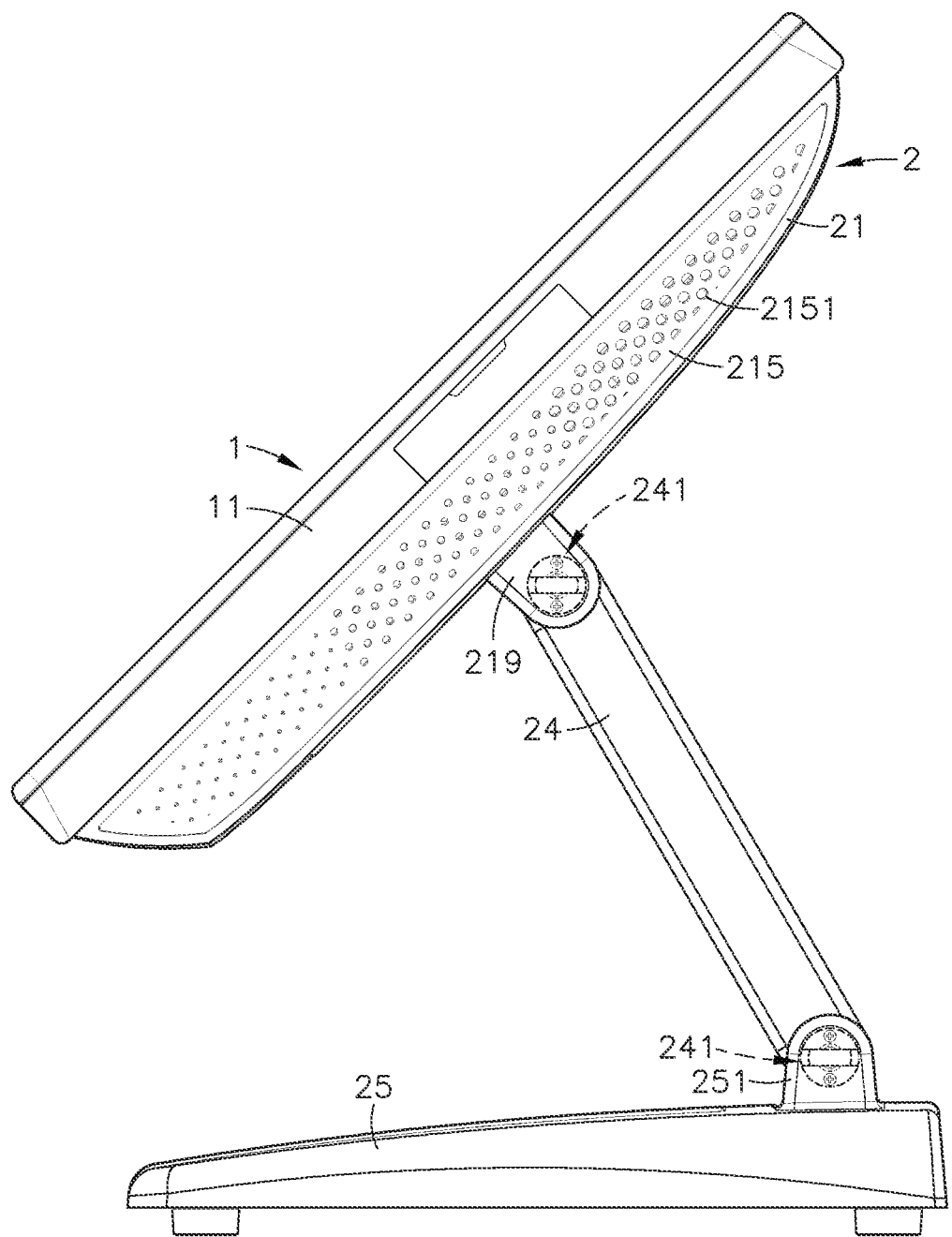
FIG. 8 is a sectional side view of the cooling structure integrated all-in-one computer in accordance with the present invention.

Referring to FIG. 8 and FIGS. 1 and 2 again, the mainframe 2 further comprises a first shaft member 219 backwardly extended from the casing 21, a base 25, a second shaft member 251 upwardly extended from the base 25, and support arm 24 having opposing top and bottom ends thereof respectively pivotally coupled to the first shaft member 219 and the second shaft member 251 by a respective hinge device 241. When wishing to adjust the angular position of the display device 1, the user can bias the hollow frame 11 to move the first shaft member 219 and the hinge device 241 at the top end of the support arm 24, thus, the display device 1 is biased relative to the support arm 24 of the mainframe 2 within a predetermined angle. The user can also bias the support arm 24 relative to the second shaft member 251 of the base 25 within a predetermined angle. When adjusting the angular position of the display device 1, the hinge devices 241 assist the biasing motion of the support arm 24 in a smooth manner, enabling the user to adjust the display device 1 to the desired view angle.

Referring to FIGS. 2, 4, 6 and 7 again, as stated above, the display module 12 is mounted in the hollow frame 11 of the display device 1; the casing 21 of the mainframe 2 is detachably slidably mounted in the back-sided opening 101 of the hollow frame 11 of the display device 1. During operation of the cooling structure integrated all-in-one computer, waste heat produced by the heat-emitting source 221 (such as CPU 2211, image processor 2212, or other kind of IC chips) of the motherboard 22 of the mainframe 2 can be directly transferred to the aluminum extruded casing 21 for quick dissipation. Because the casing 21 is made from extruded aluminum, it provides a large heat dissipation surface area, and thus, the motherboard 22 does not require a large amount of radiation fins and cooling fans for heat dissipation, and the temperature of the mainframe 2 can be constantly kept in the normal operating range. The compact design of the present invention achieves of objects of simple structure, small size and low manufacturing cost.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A cooling structure integrated all-in-one computer, comprising:
   a display device comprising a hollow frame, said hollow frame defining opposing front and back openings and a mating connection space in communication between said front and back openings, a plurality of retaining members bilaterally located in said back opening and projecting into said mating connection space, each said retaining member comprising a retaining groove, a display module mounted in said mating connection space, and a connector unit mounted in a top side inside said hollow frame and electrically coupled to said display module, said connector unit comprising a first electric connector; and
   a mainframe comprising a casing made from extruded aluminum and mounted in said back opening of said hollow frame, said casing comprising a front wall abutted against said hollow frame around said front opening, a recessed accommodation chamber located in said front wall and a plurality of engaging members located at two opposite locations in a top side in said recessed accommodation chamber, each said engaging member comprising a stepped hook portion slidably engageable into the retaining groove of one respective said retaining member of said display device, a motherboard mounted in said recessed accommodation chamber, said motherboard comprising at least one heat-emitting source abutted against an inner surface of said casing for quick dissipation of heat, a mating connector unit located at a top side of said motherboard, said mating connector unit comprising a second electric connector casing slidably detachably connectable to said first electric connector of said connector unit of said display device.

2. The cooling structure integrated all-in-one computer as claimed in claim 1, wherein said display device further comprises a control module for controlling display settings, said control module comprising a circuit board mounted in one lateral side in said back opening of said hollow frame and electrically coupled with said connector unit.

3. The cooling structure integrated all-in-one computer as claimed in claim 1, wherein each said engaging member of said mainframe comprises a base portion formed integral with one end of the respective said stepped hook portion and affixed to said front wall of said casing.

4. The cooling structure integrated all-in-one computer as claimed in claim 1, wherein each said engaging member comprises a base portion affixed to said front wall of said casing, the respective said stepped hook portion upwardly extended from said base portion, and a plurality of rails longitudinally located on said front wall of said casing.

5. The cooling structure integrated all-in-one computer as claimed in claim 1, wherein said casing of said mainframe casing further comprises a plurality of heat-transferring bearing block located in said recessed accommodation chamber and abutted against said at least one heat-emitting source of said motherboard to form a heat transfer path.

6. The cooling structure integrated all-in-one computer as claimed in claim 5, wherein said mainframe further comprises a heat sink set between said motherboard and said casing, said heat sink having two opposite surfaces thereof respectively abutted against said at least one heat-emitting source and said heat-transferring bearing blocks, said heat sink comprising a plurality of heat pipes, said heat pipes being extended out of said heat sink and bonded to an inner wall of said casing.

7. The cooling structure integrated all-in-one computer as claimed in claim 5, wherein said casing further comprises a plurality of internally threaded columns located in said recessed accommodation chamber around said heat-transferring bearing blocks for the fixation of said motherboard with screws.

8. The cooling structure integrated all-in-one computer as claimed in claim 1, wherein said casing of said mainframe casing further comprises two side panels located at two opposite sides of said recessed accommodation chamber, each said side panel comprising a plurality of through holes, a transverse slot located in a bottom side of said recessed accommodation chamber, and a back plate mounted in said transverse slot, said back plate comprising a vertical mounting wall affixed to said casing by screws and a plurality of pierced holes arranged in a line; said motherboard further comprises a plurality of ports respectively located in said pierces holes of said back plate.

9. The cooling structure integrated all-in-one computer as claimed in claim 8, wherein said casing further comprises a finger plate located at a bottom side of said transverse slot on the middle, and an outer cover detachably fastened to said transverse slot to cover said back plate.

10. The cooling structure integrated all-in-one computer as claimed in claim 1, wherein said mainframe further comprising a first shaft member backwardly extended from said casing, a base, a second shaft member upwardly extended from said base, a support arm having opposing top and bottom ends, a first hinge member connected between said first shaft member and the top end of said support arm, and a second hinge member connected between said second shaft member and the bottom end of said support arm.

\* \* \* \* \*